(12) United States Patent
Jang et al.

(10) Patent No.: US 12,433,074 B2
(45) Date of Patent: Sep. 30, 2025

(54) DISPLAY APPARATUS

(71) Applicant: SAMSUNG DISPLAY CO., LTD., Yongin-si (KR)

(72) Inventors: Jieun Jang, Yongin-si (KR); Inok Kim, Yongin-si (KR); Chansu Kim, Yongin-si (KR); Keunchan Oh, Yongin-si (KR); Gakseok Lee, Yongin-si (KR); Sanghun Lee, Yongin-si (KR); Soyun Lee, Yongin-si (KR); Changsoon Jang, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 407 days.

(21) Appl. No.: 18/113,340

(22) Filed: Feb. 23, 2023

(65) Prior Publication Data

US 2023/0378401 A1    Nov. 23, 2023

(30) Foreign Application Priority Data

May 18, 2022    (KR) .................... 10-2022-0061028

(51) Int. Cl.
*H10H 20/851*    (2025.01)
*H01L 25/075*    (2006.01)

(52) U.S. Cl.
CPC ..... *H10H 20/8514* (2025.01); *H01L 25/0753* (2013.01)

(58) Field of Classification Search
CPC .............. H10H 20/8514; H10H 29/142; H01L 25/0753; H10K 59/38; H10K 59/12; H10K 59/35; H10K 50/865
See application file for complete search history.

(56) References Cited

U.S. PATENT DOCUMENTS

| | | | |
|---|---|---|---|
| 10,181,281 | B2 | 1/2019 | Kim et al. |
| 2020/0381670 | A1 | 12/2020 | Kim et al. |
| 2022/0131038 | A1* | 4/2022 | Park ............... H10H 20/83 |

FOREIGN PATENT DOCUMENTS

| | | |
|---|---|---|
| CN | 108107628 A | 6/2018 |
| CN | 110350071 A | 10/2019 |
| CN | 112213879 A | 1/2021 |
| KR | 1020200136526 A | 12/2020 |
| KR | 102282030 B1 | 7/2021 |

* cited by examiner

*Primary Examiner* — Mohammad A Rahman
(74) *Attorney, Agent, or Firm* — CANTOR COLBURN LLP

(57) ABSTRACT

A display apparatus includes: a first sub-pixel, a second sub-pixel, and a third sub-pixel, which emit light of different colors from one another; light-emitting diodes corresponding to the first sub-pixel, the second sub-pixel, and the third sub-pixel, respectively; a functional layer arranged in a light-emitting direction of the light-emitting diodes and including a first quantum dot layer corresponding to an emission area of the first sub-pixel and a second quantum dot layer corresponding to an emission area of the second sub-pixel; and a light absorption layer disposed between the light-emitting diodes and the functional layer. At least a portion of the light absorption layer is disposed between the light-emitting diode corresponding to the first sub-pixel and the first quantum dot layer, the first sub-pixel is a red sub-pixel, and the light absorption layer includes a pigment or a dye absorbing red light.

20 Claims, 8 Drawing Sheets

DISPLAY APPARATUS

This application claims priority to Korean Patent Application No. 10-2022-0061028, filed on May 18, 2022, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

With the development of electronic apparatuses, such as mobile phones and large televisions, various types of display apparatuses applicable thereto have been developed. For example, a display apparatus widely used in the market include a liquid crystal display apparatus including a backlight unit and an organic light-emitting display apparatus emitting light of different colors from respective color areas. Also, a display apparatus including a quantum dot color conversion layer ("QD-CCL") has recently been developed. A quantum dot excited by incident light emits light having a longer wavelength than the incident light, and light in a low wavelength band is mainly used as the incident light.

As the use of the display apparatus has been diversified in recent years, various designs for improving the quality of the display apparatus have been attempted. In particular, for a high-resolution display apparatus, studies on improving the color characteristics of such display apparatus have been actively done.

SUMMARY

One or more embodiments include a display apparatus having excellent color characteristics and an improved lifespan. However, such a technical problem is an example, and one or more embodiments are not limited thereto.

Additional aspects will be set forth in part in the description which follows and, in part, will be apparent from the description, or may be learned by practice of the presented embodiments of the disclosure.

According to one or more embodiments, a display apparatus includes: a first sub-pixel, a second sub-pixel, and a third sub-pixel, which emit light of different colors from one another; light-emitting diodes corresponding to the first sub-pixel, the second sub-pixel, and the third sub-pixel, respectively, and which emit light of the same color; a functional layer arranged in a light-emitting direction of the light-emitting diodes and including a first quantum dot layer corresponding to an emission area of the first sub-pixel and a second quantum dot layer corresponding to an emission area of the second sub-pixel; and a light absorption layer disposed between the light-emitting diodes and the functional layer, where at least a portion of the light absorption layer is disposed between the light-emitting diode corresponding to the first sub-pixel and the first quantum dot layer, the first sub-pixel is a red sub-pixel, and the light absorption layer includes a pigment or a dye absorbing red light.

In an embodiment, the light absorption layer may include a blue or cyan pigment or dye.

In an embodiment, the light absorption layer may have a light transmittance of about 80% or greater in a wavelength range of about 400 nanometers (nm) to about 495 nm.

In an embodiment, the light absorption layer may have a light transmittance of about 60% or less in a wavelength range of about 600 nm to about 780 nm.

In an embodiment, a portion of the light absorption layer may overlap a partition wall arranged between the first quantum dot layer and the second quantum dot layer in a plan view.

In an embodiment, another portion of the light absorption layer may be disposed between the light-emitting diode corresponding to the second sub-pixel and the second quantum dot layer.

In an embodiment, the second sub-pixel may be a green sub-pixel, where the light absorption layer may include a pigment or a dye, which absorbs green light.

In an embodiment, the light absorption layer may include a blue pigment or dye.

In an embodiment, the light absorption layer may have a light transmittance of about 60% or less in a wavelength range of about 500 nm to about 570 nm.

In an embodiment, the light absorption layer may have a thickness of about 0.5 micrometers (μm) to about 10 μm.

According to one or more embodiments, a display apparatus includes: a first sub-pixel, a second sub-pixel, and a third sub-pixel, which emit light of different colors from one another; light-emitting diodes corresponding to the first sub-pixel, the second sub-pixel, and the third sub-pixel, respectively, and which emit blue light; a functional layer arranged in a light-emitting direction of the light-emitting diodes and including a first quantum dot layer corresponding to an emission area of the first sub-pixel and a second quantum dot layer corresponding to an emission area of the second sub-pixel, where the first quantum dot layer is configured to convert the blue light from the light-emitting diode corresponding to the first sub-pixel into red light; and a light absorption layer disposed between the light-emitting diodes and the functional layer, where at least a portion of the light absorption layer is disposed between the light-emitting diode corresponding to the first sub-pixel and the first quantum dot layer, and the light absorption layer has a light transmittance of about 60% or less in a wavelength range of about 600 nm to about 780 nm.

In an embodiment, the light absorption layer may have a light transmittance of about 80% or greater in a wavelength range of about 400 nm to about 495 nm.

In an embodiment, the light absorption layer may include a pigment or a dye, which absorbs red light.

In an embodiment, the light absorption layer may include a blue or cyan pigment or dye.

In an embodiment, a portion of the light absorption layer may overlap a partition wall arranged between the first quantum dot layer and the second quantum dot layer in a plan view.

In an embodiment, the light absorption layer may extend between the light-emitting diode corresponding to the second sub-pixel and the second quantum dot layer.

In an embodiment, the second sub-pixel may be a green sub-pixel, where the light absorption layer may include a pigment or a dye, which absorbs green light.

In an embodiment, the light absorption layer may include a blue pigment or dye.

In an embodiment, the light absorption layer may have a light transmittance of about 60% or less in a wavelength range of about 500 nm to about 570 nm.

In an embodiment, the light absorption layer may have a thickness of about 0.5 μm to about 10 μm.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
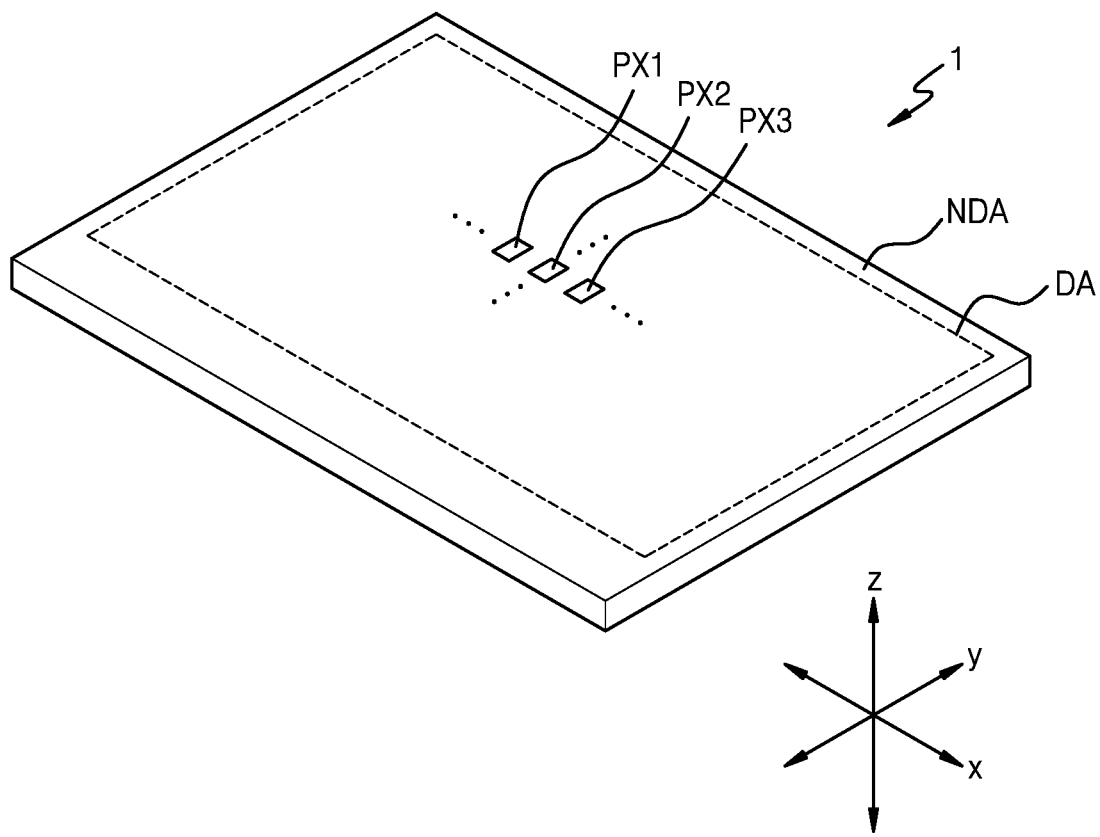
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

While such terms as "first" and "second" may be used to describe various elements, such elements must not be limited to the above terms. The above terms are used only to distinguish one element from another.

The singular forms "a," "an," and "the" as used herein are intended to include the plural forms as well unless the context clearly indicates otherwise.

It will be understood that the terms "include," "comprise," and "have" as used herein specify the presence of stated features or elements but do not preclude the addition of one or more other features or elements.

It will be further understood that, when a layer, region, or element is referred to as being on another layer, region, or element, it may be directly or indirectly on the other layer, region, or element. That is, for example, intervening layers, regions, or elements may be present.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

As used herein, the expression "A and/or B" refers to A, B, or A and B. In addition, the expression "at least one of A and B" refers to A, B, or A and B.

As used herein, the description that a wire "extends in a first direction or a second direction" covers not only a case where the wire extends in a straight line but also a case where the wire extends in a zigzag or curve in the first or second direction.

As used herein, the phrase "in a plan view" indicates that a portion of a target object is seen from above (e.g., direction −z), and the phrase "in a cross-sectional view" indicates that a portion of a target object is vertically cut and the cross-section is viewed from the side. As used herein, the term "overlap" covers overlapping "in a plan view" and "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. One or more embodiments will be described below in more detail with reference to the accompanying drawings. Those elements that are the same or are in correspondence with each other are rendered the same reference numeral regardless of the figure number.

FIG. 1 is a schematic perspective view of a display apparatus 1 according to an embodiment.

Referring to FIG. 1, the display apparatus 1 may include a display area DA where an image is displayed and a non-display area NDA where no image is displayed. The display apparatus 1 may provide an image through an array of a plurality of sub-pixels that are two-dimensionally arranged on an x-y plane in the display area DA. Each sub-pixel may emit a different color, and may be, for example, one of a red sub-pixel, a green sub-pixel, and a blue sub-pixel.

In an embodiment, the plurality of sub-pixels includes a first sub-pixel PX1, a second sub-pixel PX2, and a third sub-pixel PX3, and a case where the first sub-pixel PX1 is a red sub-pixel, the second sub-pixel PX2 is a green sub-pixel, and the third sub-pixel PX3 is a blue sub-pixel will be described below for convenience of description.

The first sub-pixel PX1, the second sub-pixel PX2, and the third sub-pixel PX3 are areas capable of emitting red light, green light, and blue light, respectively. The display apparatus 1 may provide an image by using light emitted from the sub-pixels.

The non-display area NDA is an area where no image is provided, and may entirely surround the display area DA. A driver or a main voltage line for providing an electrical signal or power to pixel circuits may be arranged in the non-display area NDA. The non-display area NDA may include a pad, which is an area to which an electronic device or a printed circuit board may be electrically connected.

As shown in FIG. 1, the display area DA may have a polygonal shape including a quadrilateral shape. For example, the display area DA may have a rectangular shape having a horizontal length greater than a vertical length, a rectangular shape having a horizontal length less than a vertical length, or a square shape. In another embodiment, a shape of the display area DA may be a circle, an ellipse, or a polygon, such as a triangle or a pentagon. Although it is shown in FIG. 1 that the display apparatus 1 is a flat panel display apparatus having a flat shape, the display apparatus 1 may be implemented in various forms, such as a flexible, foldable, or rollable display apparatus.

In an embodiment, the display apparatus 1 may be an organic light-emitting display apparatus. In another embodiment, the display apparatus 1 may be an inorganic light-emitting display apparatus or a quantum dot light-emitting display apparatus. For example, an emission layer of a display element included in the display apparatus 1 may include an organic material, an inorganic material, quantum dots, an organic material and quantum dots, an inorganic material and quantum dots, or an organic material, an inorganic material, and quantum dots. Hereinafter, a case where the display apparatus 1 is an organic light-emitting display apparatus will be mainly described in detail for convenience of description.

Figure 2:
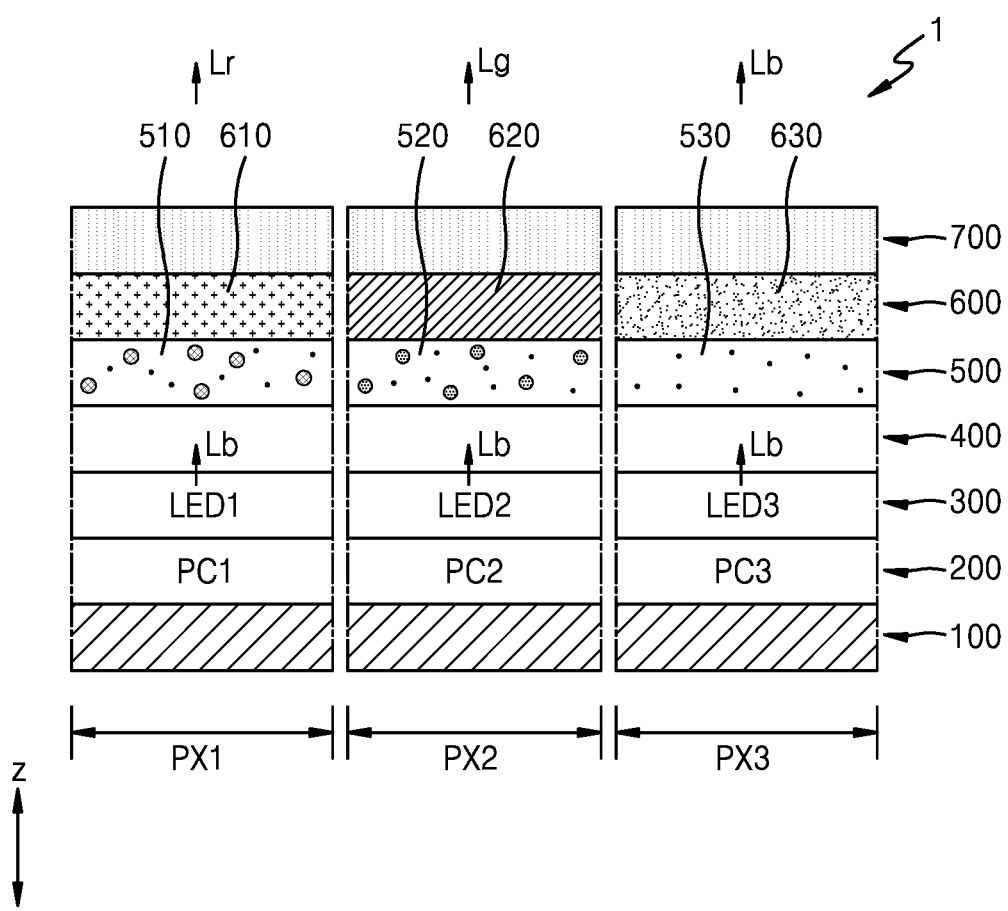
FIG. 2 is a schematic cross-sectional view of a display apparatus according to an embodiment.

FIG. 2 is a schematic cross-sectional view of the display apparatus 1 according to an embodiment.

Referring to FIG. 2, the display apparatus 1 may include a circuit layer 200 on a lower substrate 100. The circuit layer 200 includes first to third sub-pixel circuits PC1 to PC3, and the first to third sub-pixel circuits PC1 to PC3 may each include a thin-film transistor and/or a capacitor. The first to third sub-pixel circuits PC1 to PC3 may be electrically connected to first to third light-emitting diodes LED1 to LED3 of a light-emitting diode layer 300, respectively.

The first to third light-emitting diodes LED1 to LED3 may include an organic light-emitting diode including an organic material. In another embodiment, the first to third light-emitting diodes LED1 to LED3 may be an inorganic light-emitting diode including an inorganic material. The inorganic light-emitting diode may include a PN junction diode including inorganic semiconductor-based materials. When a voltage is applied to the PN junction diode in a forward direction, holes and electrons are injected, and energy generated by the recombination of holes and electrons may be converted into light energy to emit light of a certain color. The above-described inorganic light-emitting diode may have a width of several to hundreds of micrometers or several to hundreds of nanometers. In some embodiments, the first to third light-emitting diodes LED1 to LED3 may be a light-emitting diode including quantum dots. As described above, an emission layer of the first to third light-emitting diodes LED1 to LED3 may include an organic material, an inorganic material, quantum dots, an organic material and quantum dots, or an inorganic material and quantum dots.

The first to third light-emitting diodes LED1 to LED3 may emit light of the same color. For example, light (e.g., blue light Lb) emitted from the first to third light-emitting diodes LED1 to LED3 may pass through a functional layer 500 via an encapsulation layer 400 on the light-emitting diode layer 300. However, one or more embodiments are not limited thereto. In another embodiment, the first to third light-emitting diodes LED1 to LED3 may emit light of different colors from one another.

The functional layer 500 may include optical layers for converting a color of light (e.g., blue light Lb) emitted from the light-emitting diode layer 300 or transmitting the same without conversion. For example, the functional layer 500 may include quantum dot layers for converting light (e.g., blue light Lb) emitted from the light-emitting diode layer 300 into light of another color, and a transmission layer for transmitting light (e.g., blue light Lb) emitted from the light-emitting diode layer 300 without color conversion. The functional layer 500 may include a first quantum dot layer 510 corresponding to the first sub-pixel PX1, a second quantum dot layer 520 corresponding to the second sub-pixel PX2, and a transmission layer 530 corresponding to the third sub-pixel PX3. The first quantum dot layer 510 may convert blue light Lb into red light Lr, and the second quantum dot layer 520 may convert blue light Lb into green light Lg. The transmission layer 530 may allow blue light Lb to pass therethrough without converting the same.

A color filter layer 600 may be disposed on the functional layer 500. The color filter layer 600 may include first to third color filters 610 to 630 having different colors from one another. In an embodiment, the first color filter 610 may be a red color filter, the second color filter 620 may be a green color filter, and the third color filter 630 may be a blue color filter.

Light color-converted or transmitted by the functional layer 500 may have improved color purity while passing through each of the first to third color filters 610 to 630. In addition, the color filter layer 600 may prevent or reduce external light (e.g., incident light in a direction from outside the display apparatus 1 toward the display apparatus 1) from being reflected and visible to a user.

A light-transmitting base layer 700 may be disposed on the color filter layer 600. The light-transmitting base layer 700 may include glass or a light-transmitting organic material. For example, the light-transmitting base layer 700 may include a light-transmitting organic material, such as acryl-based resin.

In an embodiment, the light-transmitting base layer 700 is a kind of substrate, and may be integrated with the encapsulation layer 400 such that the functional layer 500 faces the encapsulation layer 400 after the color filter layer 600 and the functional layer 500 are formed on the light-transmitting base layer 700.

In another embodiment, after the functional layer 500 and the color filter layer 600 are sequentially formed on the encapsulation layer 400, the light-transmitting base layer 700 may be directly coated and cured on the color filter layer 600 and thus may be formed. In some embodiments, another optical film, for example, an anti-reflection ("AR") film, etc., may be disposed on the light-transmitting base layer 700.

The display apparatus 1 having the above-described structure may include an electronic device capable of displaying a moving image or a still image, such as a television, a billboard, a cinema screen, a monitor, a tablet personal computer ("PC"), a laptop, etc.

Figure 3:
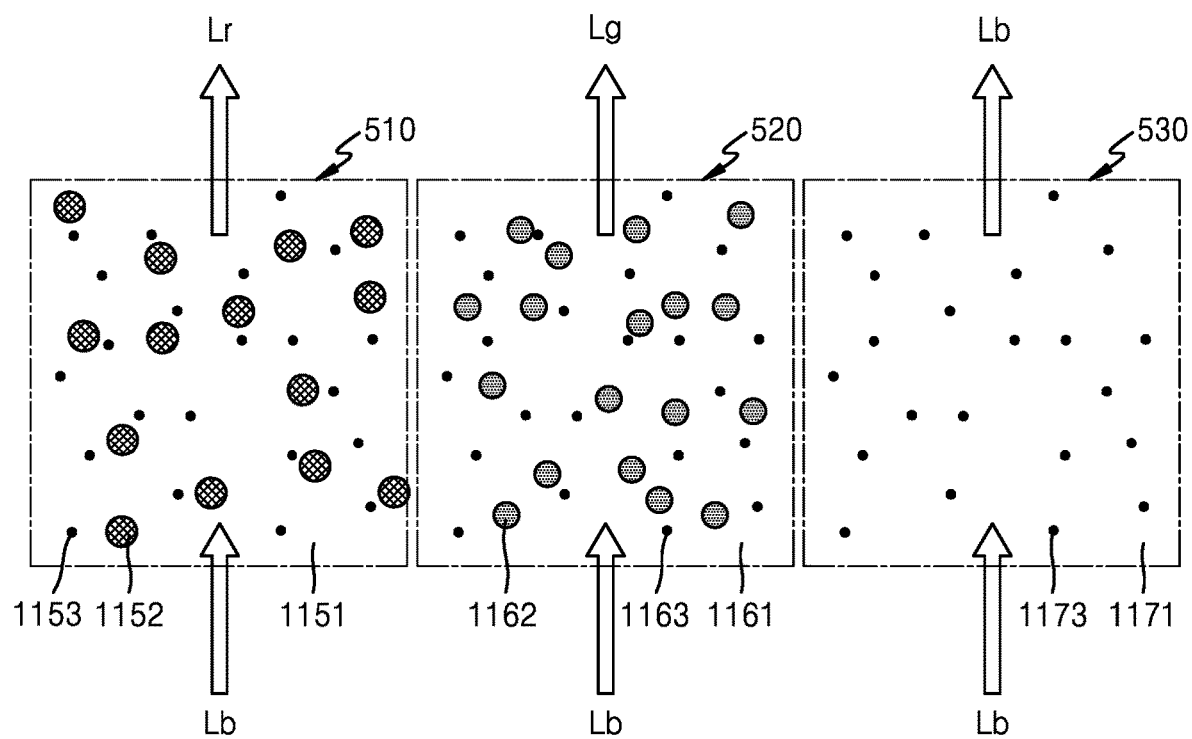
FIG. 3 shows each optical layer of a functional layer of FIG. 2.

FIG. 3 shows each optical layer of the functional layer 500 of FIG. 2.

Referring to FIG. 3, the first quantum dot layer 510 may convert incident blue light Lb into red light Lr. As shown in FIG. 3, the first quantum dot layer 510 may include a first photosensitive polymer 1151, and first quantum dots 1152 and first scattering particles 1153 dispersed in the first photosensitive polymer 1151.

The first quantum dots 1152 may be excited by the blue light Lb to isotropically emit the red light Lr having a wavelength longer than a wavelength of the blue light Lb. The first photosensitive polymer 1151 may be a light-transmissive organic material. The first scattering particles 1153 may scatter the blue light Lb that is not absorbed by the first quantum dots 1152 to allow more first quantum dots 1152 to be excited, thereby increasing color conversion efficiency. The first scattering particles 1153 may be, for example, titanium oxide ($TiO_2$) or metal particles. The first quantum dots 1152 may be selected from a group II-VI compound, a group III-V compound, a group IV-VI compound, a group IV element, a group IV compound, and a combination thereof.

The second quantum dot layer 520 may convert incident blue light Lb into green light Lg. As shown in FIG. 3, the second quantum dot layer 520 may include a second photosensitive polymer 1161, and second quantum dots 1162 and second scattering particles 1163 dispersed in the second photosensitive polymer 1161.

The second quantum dots 1162 may be excited by the blue light Lb to isotropically emit the green light Lg having a wavelength longer than a wavelength of the blue light Lb. The second photosensitive polymer 1161 may be a light-transmissive organic material.

The second scattering particles 1163 may scatter the blue light Lb that is not absorbed by the second quantum dots 1162 to allow more second quantum dots 1162 to be excited, thereby increasing color conversion efficiency. The second scattering particles 1163 may be, for example, titanium oxide ($TiO_2$) or metal particles. The second quantum dots 1162 may include a group III-VI compound, a group II-VI compound, a group III-V compound, a group compound, a group IV-VI compound, a group IV element or compound, or any combination thereof.

In some embodiments, the first quantum dots 1152 and the second quantum dots 1162 may include the same material as each other. In this case, a size of the second quantum dots 1162 may be greater than a size of the first quantum dots 1152.

Without converting blue light Lb incident on the transmission layer 530, the transmission layer 530 may transmit the blue light Lb. As shown in FIG. 3, the transmission layer 530 may include a third photosensitive polymer 1171 in which third scattering particles 1173 are dispersed. The third photosensitive polymer 1171 may be, for example, a light-transmissive organic material, such as silicone resin, epoxy resin, etc., and may include the same material as the first and second photosensitive polymers 1151 and 1161. The third scattering particles 1173 may scatter and emit the blue light Lb and may include the same material as the first and second scattering particles 1153 and 1163.

Figure 4:
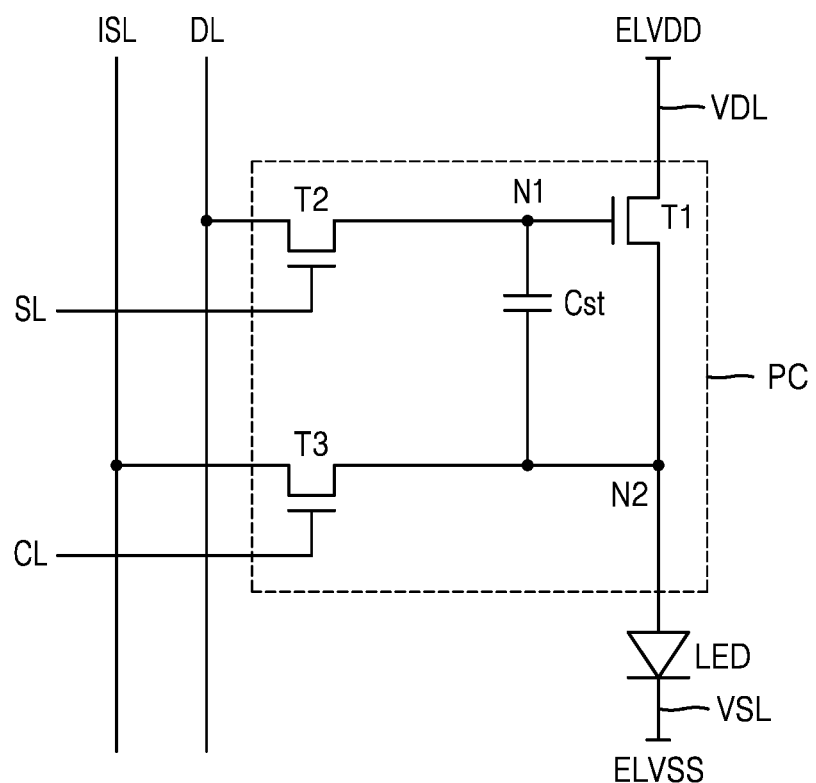
FIG. 4 is an equivalent circuit diagram showing a light-emitting diode and a sub-pixel circuit electrically connected to the light-emitting diode, which are included in a display apparatus according to an embodiment.

FIG. 4 is an equivalent circuit diagram showing a light-emitting diode LED and a sub-pixel circuit PC electrically connected to the light-emitting diode LED, which are included in a display apparatus according to an embodiment. The sub-pixel circuit PC shown in FIG. 4 may correspond to each of the first to third sub-pixel circuits PC1 to PC3 described above with reference to FIG. 2. The light-emitting diode LED of FIG. 4 may correspond to each of the first to third light-emitting diodes LED1 to LED3 described above with reference to FIG. 2.

Referring to FIG. 4, a sub-pixel electrode (e.g., an anode) of a light-emitting diode, for example, the light-emitting diode LED, may be connected to the sub-pixel circuit PC, and an opposite electrode (e.g., a cathode) of the light-emitting diode LED may be connected to a common voltage line VSL configured to provide a common voltage ELVSS or an auxiliary line (not shown). The light-emitting diode LED may emit light at a luminance corresponding to an amount of current supplied from the sub-pixel circuit PC.

The sub-pixel circuit PC may be configured to control an amount of current flowing from a driving voltage ELVDD to the common voltage ELVSS via the light-emitting diode LED, in response to a data signal. The sub-pixel circuit PC may include a first thin-film transistor T1, a second thin-film transistor T2, a third thin-film transistor T3, and a storage capacitor Cst.

Each of the first thin-film transistor T1, the second thin-film transistor T2, and the third thin-film transistor T3 may be an oxide semiconductor transistor including a semiconductor layer composed of an oxide semiconductor, or a silicon semiconductor transistor including a semiconductor layer composed of polysilicon. Depending on the type of a thin-film transistor, a first electrode may be one of a source electrode and a drain electrode, and a second electrode may be the other one of a source electrode and a drain electrode.

The first thin-film transistor T1 may be a driving thin-film transistor. A first electrode of the first thin-film transistor T1 may be connected to a driving voltage line VDL configured to supply the driving voltage ELVDD, and a second electrode of the first thin-film transistor T1 may be connected to the sub-pixel electrode of the light-emitting diode LED. A gate electrode of the first thin-film transistor T1 may be connected to a first node N1. The first thin-film transistor T1 may be configured to control an amount of current flowing through the light-emitting diode LED from the driving voltage ELVDD, in response to a voltage of the first node N1.

The second thin-film transistor T2 may be a switching thin-film transistor. A first electrode of the second thin-film transistor T2 may be connected to a data line DL, and a second electrode of the second thin-film transistor T2 may be connected to the first node N1. A gate electrode of the second thin-film transistor T2 may be connected to a scan line SL. The second thin-film transistor T2 may be turned on when a scan signal is supplied thereto via the scan line SL to electrically connect the data line DL and the first node N1 to each other.

The third thin-film transistor T3 may be an initialization thin-film transistor and/or a sensing thin-film transistor. A first electrode of the third thin-film transistor T3 may be connected to a second node N2, and a second electrode of the third thin-film transistor T3 may be connected to a sensing line ISL. A gate electrode of the third thin-film transistor T3 may be connected to a control line CL.

The storage capacitor Cst may be connected between the first node N1 and the second node N2. For example, a first capacitor electrode of the storage capacitor Cst may be connected to the gate electrode of the first thin-film transistor T1, and a second capacitor electrode of the storage capacitor Cst may be connected to the sub-pixel electrode of the light-emitting diode LED.

Although the first thin-film transistor T1, the second thin-film transistor T2, and the third thin-film transistor T3 are shown as NMOS transistors in FIG. 4, one or more embodiments are not limited thereto. For example, at least one of the first thin-film transistor T1, the second thin-film transistor T2, and the third thin-film transistor T3 may be a PMOS transistor in another embodiment.

Although FIG. 4 shows three thin-film transistors, one or more embodiments are not limited thereto. The sub-pixel circuit PC may include four or more thin-film transistors in another embodiment.

Figure 5:
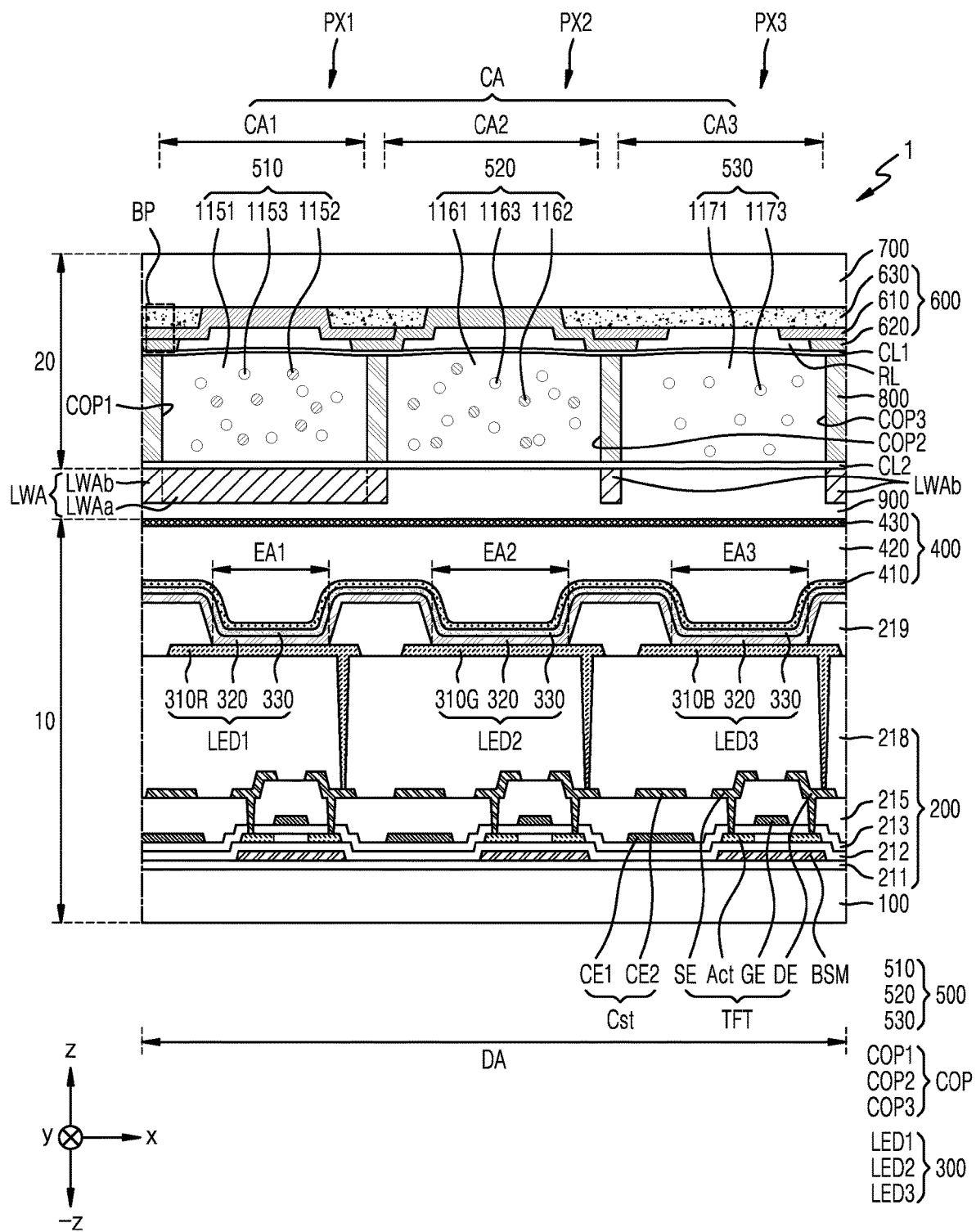
FIG. 5 is a schematic cross-sectional view of a display apparatus according to an embodiment.

FIG. 5 is a schematic cross-sectional view of the display apparatus 1 according to an embodiment.

Referring to FIG. 5, the display apparatus 1 includes the first sub-pixel PX1, the second sub-pixel PX2, and the third sub-pixel PX3. The first sub-pixel PX1 may emit red light Lr, the second sub-pixel PX2 may emit green light Lg, and the third sub-pixel PX3 may emit blue light Lb.

In an embodiment, the display apparatus 1 may include a display panel 10 and a color conversion panel 20. In this regard, the display apparatus 1 may be obtained by forming each of the display panel 10 and the color conversion panel 20 and then coupling each other. However, one or more embodiments are not limited thereto. In some embodiments, the display apparatus 1 may be obtained by sequentially forming the lower substrate 100, the circuit layer 200, the light-emitting diode layer 300, the encapsulation layer 400, a light absorption layer LWA, the functional layer 500, the color filter layer 600, and the light-transmitting base layer 700.

The display panel 10 may include the lower substrate 100, the circuit layer 200 on the lower substrate 100, and the first to third light-emitting diodes LED1 to LED3 to which a sub-pixel circuit of the circuit layer 200 is electrically connected.

The circuit layer 200 includes a plurality of sub-pixel circuits corresponding to the first to third sub-pixels PX1 to PX3, respectively. The sub-pixel circuit may include a plurality of thin-film transistors TFT and the storage capacitor Cst as described above with reference to FIG. 4. For example, a thin-film transistor TFT may be a driving thin-film transistor, e.g., the first thin-film transistor T1 (of FIG. 4).

Hereinafter, a stacked structure of the display panel 10 will be described in detail.

The lower substrate 100 may include a glass material, a ceramic material, a metal material, or a flexible or bendable material. When the lower substrate 100 is flexible or bendable, the lower substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The lower substrate 100 may have a single-layer or multi-layer structure including the above material. In the multi-layer structure, the lower substrate 100 may further include an inorganic layer. In an embodiment, the lower substrate 100 may have a structure of an organic material/an inorganic material/an organic material.

A barrier layer (not shown) may be further disposed between the lower substrate 100 and a first buffer layer 211. The barrier layer may prevent or reduce permeation of impurities from the lower substrate 100, etc. into a semiconductor layer Act. The barrier layer may include an inorganic material, such as oxide or nitride, an organic material, or an organic-inorganic compound, and may have a single-layer or multi-layer structure including an inorganic material and an organic material.

A bias electrode BSM may be disposed on the first buffer layer 211 to correspond to the thin-film transistor TFT. In an embodiment, a voltage may be applied to the bias electrode BSM. In addition, the bias electrode BSM may prevent external light from reaching the semiconductor layer Act. Accordingly, characteristics of the thin-film transistor TFT may be stabilized. The bias electrode BSM may be omitted in some cases.

The semiconductor layer Act may be disposed on a second buffer layer 212. The semiconductor layer Act may include amorphous silicon or polysilicon. In another embodiment, the semiconductor layer Act may include oxide of at least one material selected from the group including indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layer Act may include a Zn oxide-based material, such as Zn oxide, In—Zn oxide, Ga—In—Zn oxide, etc. In another embodiment, the semiconductor layer Act may be an In—Ga—Zn—O ("IGZO"), In—Sn—Zn—O ("ITZO"), or In—Ga—Sn—Zn—O ("IGTZO") semiconductor containing metal, such as indium (In), gallium (Ga), and tin (Sn), in zinc oxide. The semiconductor layer Act may include a channel region and source and drain regions disposed on both sides of the channel region.

A gate electrode GE may be disposed above the semiconductor layer Act with a gate insulating layer 213 therebetween. The gate electrode GE may at least partially overlap the semiconductor layer Act in a plan view. The gate electrode GE includes molybdenum (Mo), aluminum (Al), copper (Cu), titanium (Ti), etc. and may include a single layer or a plurality of layers. As an example, the gate electrode GE may be a single layer of molybdenum (Mo). A first electrode CE1 of the storage capacitor Cst may be disposed on the same layer as the gate electrode GE. The first electrode CE1 may include the same material as the gate electrode GE.

Although FIG. 5 shows the gate electrode GE of the thin-film transistor TFT and the first electrode CE1 of the storage capacitor Cst separately arranged, the storage capacitor Cst may overlap the thin-film transistor TFT in a plan view. In this case, the gate electrode GE of the thin-film transistor TFT may serve as the first electrode CE1 of the storage capacitor Cst.

An interlayer insulating layer 215 may be provided to cover the gate electrode GE and the first electrode CE1 of the storage capacitor Cst. The interlayer insulating layer 215 may include silicon oxide, silicon nitride, silicon oxynitride, aluminum oxide, titanium oxide, tantalum oxide, hafnium oxide, or zinc oxide.

A second electrode CE2 of the storage capacitor Cst, a source electrode SE, and a drain electrode DE may be disposed on the interlayer insulating layer 215.

The second electrode CE2 of the storage capacitor Cst, the source electrode SE, and the drain electrode DE may include a conductive material including molybdenum (Mo), aluminum (Al), copper (Cu), titanium (Ti), etc. and may include a plurality of layers or a single layer including the above material. As an example, the second electrode CE2, the source electrode SE, and the drain electrode DE may have a multi-layer structure of Ti/Al/Ti. The source electrode SE and the drain electrode DE may be connected to a source region or a drain region of the semiconductor layer Act through a contact hole.

The second electrode CE2 of the storage capacitor Cst overlaps the first electrode CE1 with the interlayer insulating layer 215 therebetween in a plan view and may constitute the storage capacitor Cst. In this case, the interlayer insulating layer 215 may serve as a dielectric layer of the storage capacitor Cst.

A planarization layer 218 may be disposed on the second electrode CE2 of the storage capacitor Cst, the source electrode SE, and the drain electrode DE. The planarization layer 218 may include, in a single layer or a plurality of layers, a film including an organic material and may provide a flat upper surface. The planarization layer 218 may include a general commercial polymer, such as benzocyclobutene ("BCB"), polyimide, hexamethyldisiloxane ("HMDSO"), poly(methyl methacrylate) ("PMMA"), or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The first light-emitting diode LED1, the second light-emitting diode LED2, and the third light-emitting diode LED3 may be disposed on the planarization layer 218. The first light-emitting diode LED1, the second light-emitting diode LED2, and the third light-emitting diode LED3 may include a first sub-pixel electrode 310R, a second sub-pixel electrode 310G, and a third sub-pixel electrode 310B, respectively. In an embodiment, the first light-emitting diode LED1, the second light-emitting diode LED2, and the third light-emitting diode LED3 may commonly include an emission layer 320 and an opposite electrode 330.

The first sub-pixel electrode 310R, the second sub-pixel electrode 310G, and the third sub-pixel electrode 310B may be a (semi)transmissive electrode or a reflective electrode. In some embodiments, the first sub-pixel electrode 310R, the second sub-pixel electrode 310G, and the third sub-pixel electrode 310B may include a reflective layer including silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent or semitransparent electrode layer on the reflective layer. The transparent or semitransparent electrode layer may include at least one selected from the group including indium tin oxide ("ITO"), indium zinc oxide ("IZO"), zinc oxide, indium oxide, indium gallium oxide ("IGO"), and aluminum zinc oxide ("AZO"). In an embodiment, the first sub-pixel electrode 310R, the second sub-pixel electrode 310G, and the third sub-pixel electrode 310B may be provided in ITO/Ag/ITO.

A first bank layer 219 may be disposed on the planarization layer 218. The first bank layer 219 may define openings exposing central portions of the first sub-pixel electrode 310R, the second sub-pixel electrode 310G, and the third sub-pixel electrode 310B, respectively. The first bank layer 219 may cover respective edges of the first sub-pixel electrode 310R, the second sub-pixel electrode 310G, and the third sub-pixel electrode 310B. The first bank layer 219 may prevent or reduce an arc, etc. from occurring at edges of the first sub-pixel electrode 310R, the second sub-pixel electrode 310G, and the third sub-pixel electrode 310B by increasing a distance between the edges of the first sub-pixel electrode 310R, the second sub-pixel electrode 310G, and the third sub-pixel electrode 310B and the opposite electrode 330 arranged above the first sub-pixel electrode 310R, the second sub-pixel electrode 310G, and the third sub-pixel electrode 310B.

The first bank layer 219 may be formed by a method, such as spin coating, using one or more organic insulating materials selected from the group including polyimide, polyamide, acrylic resin, BCB, and phenolic resin.

The emission layer 320 of the first light-emitting diode LED1, the second light-emitting diode LED2, and the third light-emitting diode LED3 may include an organic material including a fluorescent or phosphorescent material that emits red, green, blue, or white light. The emission layer 320 may include a low-molecular weight organic material or a polymer organic material, and functional layers, such as a hole transport layer ("HTL"), a hole injection layer ("HIL"), an electron transport layer ("ETL"), and an electron injection layer ("EIL"), may be optionally further disposed under and on the emission layer 320. Although FIG. 5 shows the emission layer 320 formed as one body over the first sub-pixel electrode 310R, the second sub-pixel electrode 310G, and the third sub-pixel electrode 310B, one or more embodiments are not limited thereto, and various modifications may be made, for example, the emission layer 320 may be arranged in correspondence with each of the first sub-pixel electrode 310R, the second sub-pixel electrode 310G, and the third sub-pixel electrode 310B.

As described above, the emission layer 320 may include a single layer that covers the first sub-pixel electrode 310R, the second sub-pixel electrode 310G, and the third sub-pixel electrode 310B. However, the emission layer 320 may include patterned layers corresponding to the first sub-pixel electrode 310R, the second sub-pixel electrode 310G, and the third sub-pixel electrode 310B, respectively. In any case, the emission layer 320 may be a first color emission layer. The first color emission layer may be a single layer over the first sub-pixel electrode 310R, the second sub-pixel electrode 310G, and the third sub-pixel electrode 310B, or may be patterned to correspond to each of the first sub-pixel electrode 310R, the second sub-pixel electrode 310G, and the third sub-pixel electrode 310B. The first color emission layer may emit light in a first wavelength band, for example, blue light. In an embodiment, the emission layer 320 may emit light having a wavelength of 450 nanometers (nm) to 495 nm.

The opposite electrode 330 may be positioned on the emission layer 320 to correspond to the first sub-pixel electrode 310R, the second sub-pixel electrode 310G, and the third sub-pixel electrode 310B. The opposite electrode 330 may be formed as a single electrode for a plurality of organic light-emitting diodes. In an embodiment, the opposite electrode 330 may be a transparent or semitransparent electrode and may include a metal thin film with a low work function including Li, Ca, LiF/Ca, LiF/Al, Al, Ag, Mg, and a compound thereof. In addition, a transparent conductive oxide ("TCO") layer, such as ITO, IZO, ZnO, or $In_2O_3$, may be further disposed on the metal thin film.

In an embodiment, one light-emitting diode LED, for example, each of the first light-emitting diode LED1, the second light-emitting diode LED2, and the third light-emitting diode LED3, may include a plurality of emission layers 320 sequentially stacked. For example, each of the first light-emitting diode LED1, the second light-emitting diode LED2, and the third light-emitting diode LED3 may include a first emission layer and a second emission layer sequentially stacked. A negative charge generation layer and a positive charge generation layer may be disposed between the adjacent emission layers 320. For example, a negative charge generation layer and a positive charge generation layer may be disposed between the first emission layer and the second emission layer. In this case, a sub-pixel electrode, a first emission layer, a negative charge generation layer, a positive charge generation layer, a second emission layer, and the opposite electrode 330 may be sequentially stacked in one light-emitting diode LED. For example, the first sub-pixel electrode 310R, a first emission layer, a negative charge generation layer, a positive charge generation layer, a second emission layer, and the opposite electrode 330 may be sequentially stacked in the first light-emitting diode LED1. For example, the negative charge generation layer may supply electrons. The negative charge generation layer may be an n-type charge generation layer. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

First to third emission areas EA1 to EA3 may correspond to the first to third sub-pixels PX1 to PX3, respectively. The first to third emission areas EA1 to EA3 may be areas where light generated by the first to third light-emitting diodes LED1 to LED3 is externally emitted, respectively. In an embodiment, the first emission area EA1 may be defined as a portion of the first sub-pixel electrode 310R exposed by the opening of the first bank layer 219. In an embodiment, the second emission area EA2 may be defined as a portion of the second sub-pixel electrode 310G exposed by the opening of the first bank layer 219. In an embodiment, the third emission area EA3 may be defined as a portion of the third sub-pixel electrode 310S exposed by the opening of the first bank layer 219.

The first emission area EA1, the second emission area EA2, and the third emission area EA3 may be apart from one another. An area of the display area DA minus the first emission area EA1, the second emission area EA2, and the third emission area EA3 may be a non-emission area. The first emission area EA1, the second emission area EA2, and the third emission area EA3 may be divided by the non-emission area.

A spacer (not shown) for preventing a mask stab may be further disposed on the first bank layer 219. In an embodiment, the spacer may be integrally formed with the first bank layer 219. For example, the spacer and the first bank layer 219 may be simultaneously formed during the same process by using a halftone mask process.

The first light-emitting diode LED1, the second light-emitting diode LED2, and the third light-emitting diode LED3 may be easily damaged by external moisture or oxygen and thus may be covered and protected by the encapsulation layer 400. The encapsulation layer 400 may cover the display area DA and may extend out of the display area DA. The encapsulation layer 400 may include at least one organic encapsulation layer and at least one inorganic encapsulation layer. For example, the encapsulation layer 400 may include a first inorganic encapsulation layer 410, an organic encapsulation layer 420, and a second inorganic encapsulation layer 430.

Because the first inorganic encapsulation layer 410 is formed along a structure therebelow, an upper surface of the first inorganic encapsulation layer 410 may not be flat. The organic encapsulation layer 420 may cover the first inorganic encapsulation layer 410. Unlike the first inorganic encapsulation layer 410, an upper surface of the organic encapsulation layer 420 may be substantially flat.

The first inorganic encapsulation layer 410 and the second inorganic encapsulation layer 430 may include one or more inorganic materials among aluminum oxide, titanium oxide, tantalum oxide, hafnium oxide, zinc oxide, silicon oxide, silicon nitride, and silicon oxynitride. The organic encapsulation layer 420 may include a polymer-based material. Examples of the polymer-based material may include acryl-based resin, epoxy-based resin, polyimide, and polyethylene. In an embodiment, the organic encapsulation layer 420 may include acrylate. The organic encapsulation layer 420 may be formed by curing a monomer or applying a polymer.

Even when cracks occur in the encapsulation layer 400, the encapsulation layer 400 may prevent, via the above-described multi-layer structure, the cracks from being connected to each other between the first inorganic encapsulation layer 410 and the organic encapsulation layer 420 or between the organic encapsulation layer 420 and the second inorganic encapsulation layer 430. Thus, formation of a path through which external moisture or oxygen permeates the display area DA may be prevented or reduced.

In some embodiments, other layers, such as a capping layer, may be disposed between the first inorganic encapsulation layer 410 and the opposite electrode 330.

The color conversion panel 20 may include the light-transmitting base layer 700, the color filter layer 600, a refraction layer RL, a first capping layer CL1, a second bank layer 800, the functional layer 500, a second capping layer CL2, and the light absorption layer LWA. In an embodiment, the light-transmitting base layer 700 is a kind of substrate and may be an upper substrate disposed above the lower substrate 100 with light-emitting diodes therebetween. The light-transmitting base layer 700 may be disposed above the light-emitting diodes, for example, the first light-emitting diode LED1, the second light-emitting diode LED2, and the third light-emitting diode LED3.

The light-transmitting base layer 700 may include a central area CA overlapping the light-emitting diodes in a plan view. In an embodiment, the central area CA may include a first central area CA1, a second central area CA2, and a third central area CA3. The first central area CA1 may overlap the first light-emitting diode LED1 and the first emission area EA1. The second central area CA2 may overlap the second light-emitting diode LED2 and the second emission area EA2. The third central area CA3 may overlap the third light-emitting diode LED3 and the third emission area EA3 in a plan view.

The light-transmitting base layer 700 may include glass or polymer resin. When the light-transmitting base layer 700 is flexible or bendable, the light-transmitting base layer 700 may include, for example, polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate.

The color filter layer 600 may be disposed on a lower surface of the light-transmitting base layer 700 positioned in a direction (e.g., a direction −z) from the light-transmitting base layer 700 toward the lower substrate 100. The color filter layer 600 may include the first color filter 610, the second color filter 620, and the third color filter 630. The first color filter 610 may be disposed over the first central area CA1. The second color filter 620 may be disposed over the second central area CA2. The third color filter 630 may be disposed over the third central area CA3.

The first to third color filters 610 to 630 may include photosensitive resin. In addition, each of the first to third color filters 610 to 630 may include a pigment or a dye representing a unique color.

The first color filter 610 may be a red color filter. For example, the first color filter 610 may transmit only light having a wavelength of 630 nm to 780 nm. The first color filter 610 may include a red pigment or dye. The second color filter 620 may be a green color filter. For example, the second color filter 620 may transmit only light having a wavelength of 495 nm to 570 nm. The second color filter 620 may include a green pigment or dye. The third color filter 630 may be a blue color filter. For example, the third color filter 630 may transmit only light having a wavelength of 450 nm to 495 nm. The third color filter 630 may include a blue pigment or dye.

The color filter layer 600 may reduce external light reflection of the display apparatus 1. For example, when external light reaches the first color filter 610, only light of a previously set wavelength described above may pass through the first color filter 610, and light of other wavelengths may be absorbed by the first color filter 610. Accordingly, only light of the previously set wavelength among external light incident on the display apparatus 1 may pass through the first color filter 610, and a portion thereof may be reflected by the opposite electrode 330 and/or the first sub-pixel electrode 310R arranged below and be emitted back to the outside. Because only a portion of external light incident on a place where first sub-pixel PX1 is located is externally reflected, reflection of external light may be reduced. This description may also be applied to the second color filter 620 and the third color filter 630.

The first color filter 610, the second color filter 620, and the third color filter 630 may overlap one another in a plan view. The first color filter 610, the second color filter 620, and the third color filter 630 may overlap one another between one of the central area CA and another of the central area CA. For example, the first color filter 610, the second color filter 620, and the third color filter 630 may overlap one another between the first central area CA1 and the second central area CA2. In this case, the third color filter 630 may be arranged between the first central area CA1 and the second central area CA2. The first color filter 610 may extend from the first central area CA1 and overlap the third color filter 630. The second color filter 620 may extend from the second central area CA2 and overlap the third color filter 630 in a plan view.

The first color filter 610, the second color filter 620, and the third color filter 630 may overlap one another between the second central area CA2 and the third central area CA3 in a plan view. The first color filter 610 may be arranged between the second central area CA2 and the third central area CA3. The second color filter 620 may extend from the second central area CA2 and overlap the first color filter 610. The third color filter 630 may extend from the third central area CA3 and overlap the first color filter 610.

The first color filter 610, the second color filter 620, and the third color filter 630 may overlap one another between the third central area CA3 and the first central area CA1 in a plan view. The second color filter 620 may be arranged between the third central area CA3 and the first central area CA1. The third color filter 630 may extend from the third central area CA3 and overlap the second color filter 620. The first color filter 610 may extend from the first central area CA1 and overlap the second color filter 620 in a plan view.

As described above, the first color filter 610, the second color filter 620, and the third color filter 630 may overlap one another in a plan view, thereby defining a light-blocking portion BP. In another embodiment, the light-blocking portion BP may be formed by overlapping two color filter materials selected from among the first color filter 610, the second color filter 620, and the third color filter 630. Accordingly, even without a separate light-blocking member, the color filter layer 600 may prevent or reduce color mixing.

The refraction layer RL may be arranged in the central area CA. The refraction layer RL may be arranged in each of the first central area CA1, the second central area CA2, and the third central area CA3. The refraction layer RL may include an organic material. In an embodiment, a refractive index of the refraction layer RL may be less than a refractive index of the first capping layer CL1. In an embodiment, a refractive index of the refraction layer RL may be less than a refractive index of the color filter layer 600. Accordingly, the refraction layer RL may condense light. In some embodiments, the refraction layer RL may be omitted.

The first capping layer CL1 may be disposed on the refraction layer RL and the color filter layer 600. In an embodiment, the first capping layer CL1 may be disposed between the color filter layer 600 and the functional layer 500. The first capping layer CL1 may protect the refraction layer RL and the color filter layer 600. The first capping layer CL1 may prevent or reduce impurities, such as moisture and/or air, from permeating from the outside and damaging or polluting the refraction layer RL and/or the color filter layer 600. The first capping layer CL1 may include an inorganic material. In some embodiments, the first capping layer CL1 may be omitted.

The second bank layer 800 may be disposed on the first capping layer CL1. The second bank layer 800 may include an organic material. In some cases, the second bank layer 800 may include a light-blocking material to serve as a light-blocking layer. The light-blocking material may include, for example, at least one of black pigment, black dye, black particles, or metal particles.

In the second bank layer 800, central openings COP may be defined as partition walls. A central opening COP may overlap the central area CA in a plan view. A first central opening COP1 may overlap the first central area CA1. A second central opening COP2 may overlap the second central area CA2. A third central opening COP3 may overlap the third central area CA3 in a plan view.

The functional layer 500 may fill the central opening COP. In an embodiment, the functional layer 500 may include at least one of quantum dots and scattering particles. In an embodiment, the functional layer 500 may include the first quantum dot layer 510, the second quantum dot layer 520, and the transmission layer 530. The first quantum dot layer 510, the second quantum dot layer 520, and the transmission layer 530 may be divided by the partition walls of the second bank layer 800.

The first quantum dot layer 510 may overlap the first central area CA1 in a plan view. The first quantum dot layer 510 may fill the first central opening COP1. The first quantum dot layer 510 may overlap the first emission area EA1. The first quantum dot layer 510 may be arranged in a light-emitting direction (e.g., a direction z) of the first light-emitting diode LED1. Here, the light-emitting direction may correspond to a thickness direction of the display panel 10 or the light absorption layer LWA.

The first quantum dot layer 510 may convert light in a first wavelength band generated by the emission layer 320 on the first sub-pixel electrode 310R into light in a second wavelength band. In an embodiment, the first quantum dot layer 510 may convert blue light into red light. For example, when light having a wavelength of 450 nm to 495 nm is generated by the emission layer 320 on the first sub-pixel electrode 310R, the first quantum dot layer 510 may convert the light into light having a wavelength of 630 nm to 780 nm. Accordingly, in the first sub-pixel PX1, light having a wavelength of 630 nm to 780 nm may be externally emitted through the light-transmitting base layer 700.

In an embodiment, the first quantum dot layer 510 may include the first photosensitive polymer 1151, and the first quantum dots 1152 and the first scattering particles 1153 dispersed in the first photosensitive polymer 1151.

The second quantum dot layer 520 may overlap the second central area CA2. The second quantum dot layer 520 may fill the second central opening COP2. The second quantum dot layer 520 may overlap the second emission area EA2 in a plan view. The second quantum dot layer 520 may be arranged in a light-emitting direction (e.g., the direction z) of the second light-emitting diode LED2.

The second quantum dot layer 520 may convert light in a first wavelength band generated by the emission layer 320 on the second sub-pixel electrode 310G into light in a third wavelength band. For example, the second quantum dot layer 520 may convert blue light into green light. For example, when light having a wavelength of 450 nm to 495 nm is generated by the emission layer 320 on the second sub-pixel electrode 310G, the second quantum dot layer 520 may convert the light into light having a wavelength of 495 nm to 570 nm. Accordingly, in the second sub-pixel PX2, light having a wavelength of 495 nm to 570 nm may be externally emitted through the light-transmitting base layer 700.

In an embodiment, the second quantum dot layer 520 may include the second photosensitive polymer 1161, and the second quantum dots 1162 and the second scattering particles 1163 dispersed in the second photosensitive polymer 1161.

The transmission layer 530 may overlap the third central area CA3 in a plan view. The transmission layer 530 may fill the third central opening COP3. The transmission layer 530 may overlap the third emission area EA3. The transmission layer 530 may be arranged in a light-emitting direction (e.g., the direction z) of the third light-emitting diode LED3.

The transmission layer 530 may externally emit light generated by the emission layer 320 disposed on the third sub-pixel electrode 3106 without wavelength conversion. For example, the transmission layer 530 may allow blue light to pass therethrough without converting the same. For example, when light having a wavelength of 450 nm to 495 nm is generated by the emission layer 320 on the third sub-pixel electrode 310B, the transmission layer 530 may externally emit the light without wavelength conversion.

For example, in an embodiment, the transmission layer 530 may include the third photosensitive polymer 1171 in which the third scattering particles 1173 are dispersed. In an embodiment, the transmission layer 530 may not include quantum dots.

At least one of the first quantum dots 1152 and the second quantum dots 1162 may include a semiconductor material, such as cadmium sulfide (CdS), cadmium telluride (CdTe), zinc sulfide (ZnS), or indium phosphide (InP). The size of a quantum dot may be several nanometers, and a wavelength of light after conversion may vary according to the size of a quantum dot.

In an embodiment, a core of the quantum dot may be selected from a group III-VI compound, a group II-VI compound, a group III-V compound, a group III-VI compound, a group compound, a group IV-VI compound, a group IV element or compound, or any combination thereof.

The group II-VI compound may be selected from: a binary compound selected from CdSe, CdTe, ZnS, ZnSe, ZnTe, ZnO, HgS, HgSe, HgTe, MgSe, MgS, and any mixture thereof; a ternary compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The group III-V compound may be selected from: a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, AlPSb, InGaP, InNP, InNAs, InNSb, InPAs, InPSb, GaAlNP, and any mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof. The group III-V compound may further include a group II element. The group III-V compound further including a group II element may include InZnP, InGaZnP, InAlZnP, etc.

The group III-VI compound may include a binary compound, such as GaS, Ga$_2$S$_3$, GaSe, Ga$_2$Se$_3$, GaTe, InS, InSe, In$_2$S$_3$, In$_2$Se$_3$, InTe, etc., a ternary compound, such as InGaS$_3$, InGaSe$_3$, etc., or any combination thereof.

The group compound may include a ternary compound, such as AgInS, AgInS$_2$, AgInSe$_2$, AgGaS, AgGaS$_2$, AgGaSe$_2$, CuInS, CuInS$_2$, CuInSe$_2$, CuGaS$_2$, CuGaSe$_2$, CuGaO$_2$, AgGaO$_2$, AgAlO$_2$, etc., a quaternary compound, such as AgInGaS$_2$, AgInGaSe$_2$, etc., or any combination thereof. The group IV-VI compound may be selected from: a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof. The group IV element may be selected from Si, Ge, and any mixture thereof. The group IV compound may include a binary compound selected from SiC, SiGe, and any mixture thereof.

In this regard, the binary compound, the ternary compound, or the quaternary compound may be present in particles at a uniform concentration, or may be present in the same particles in partially different concentration distributions. That is, the above formula denotes types of elements included in a compound, and an element ratio in the compound may be different. For example, AgInGaS$_2$ may denote AgIn$_x$Ga$_{1-x}$S$_2$ (where x is a real number between 0 and 1).

In addition, a core/shell structure in which a quantum dot encloses another quantum dot may be possible. An interface between the core and the shell may have a concentration gradient in which the concentration of elements present in the shell decreases closer to its center.

In some embodiments, the quantum dot may have a core-shell structure including a core including the nanocrystals and a shell surrounding the core. The shell of the quantum dot may serve as a protection layer for maintaining semiconductor properties by preventing chemical modification of the core and/or a charging layer for imparting electrophoretic properties to the quantum dot. The shell may include a single layer or a plurality of layers. An interface between the core and the shell may have a concentration gradient in which the concentration of elements present in the shell decreases closer to its center. Examples of the shell of the quantum dot may include a metal or non-metal oxide, a semiconductor compound, or a combination thereof.

For example, the metal or non-metal oxide may be a binary compound, such as SiO$_x$, Al$_2$O$_3$, TiO$_2$, ZnO$_x$, MnO, Mn$_2$O$_3$, Mn$_3$O$_4$, CuO, FeO, Fe$_2$O$_3$, Fe$_3$O$_4$, CoO, Co$_3$O$_4$, NiO, etc., or a ternary compound, such as MgAl$_2$O$_4$, CoFe$_2$O$_4$, NiFe$_2$O$_4$, CoMn$_2$O$_4$, etc., but one or more embodiments are not limited thereto.

In addition, examples of the semiconductor compound may include CdS, CdSe, CdTe, ZnS, ZnSe, ZnTe, ZnSeS, ZnTeS, GaAs, GaP, GaS, GaSe, AgGaS, AgGaS$_2$, GaSb, HgS, HgSe, HgTe, InAs, InP, InGaP, InSb, AlAs, AlP, AlSb, etc., but one or more embodiments are not limited thereto.

Each element included in a multi-element compound, such as the binary compound or the ternary compound, may be present in particles at a uniform concentration or a non-uniform concentration. That is, the above formula denotes types of elements included in a compound, and an element ratio in the compound may be different.

In an embodiment, the quantum dot may have a full width at half maximum ("FWHM") of the light-emitting wavelength spectrum that is equal to or less than about 45 nm, particularly equal to or less than about 40 nm, and more particularly equal to or less than about 30 nm, and in this range, color purity or color reproducibility may be improved. In addition, a viewing angle of light may be improved because light emitted through the quantum dot is emitted in all directions.

In addition, a shape of the quantum dot is not particularly limited to that generally used in the art, and for example, the quantum dot may have the shape of a spherical, pyramidal, multi-arm, or cubic nanoparticle, a nanotube, a nanowire, a nanofiber, a nanoplatelet particle, etc.

The quantum dot may adjust a color of emitted light according to a particle size, and accordingly, the quantum dot may have various emission colors, such as blue, red, green, etc.

The first scattering particles 1153, the second scattering particles 1163, and the third scattering particles 1173 may scatter light, thereby allowing more light to be emitted. The first scattering particles 1153, the second scattering particles 1163, and the third scattering particles 1173 may increase light-emitting efficiency. At least one of the first scattering particles 1153, the second scattering particles 1163, and the third scattering particles 1173 may include any material of metal or metal oxide for evenly scattering light. For example, at least one of the first scattering particles 1153, the second scattering particles 1163, and the third scattering particles 1173 may be at least one of $TiO_2$, $ZrO_2$, $Al_2O_3$, $In_2O_3$, ZnO, $SnO_2$, $Sb_2O_3$, and ITO. In addition, at least one of the first scattering particles 1153, the second scattering particles 1163, and the third scattering particles 1173 may have a refractive index of 1.5 or greater. Accordingly, light-emitting efficiency of the functional layer 500 may be improved. In some embodiments, at least one of the first scattering particles 1153, the second scattering particles 1163, and the third scattering particles 1173 may be omitted.

The first photosensitive polymer 1151, the second photosensitive polymer 1161, and the third photosensitive polymer 1171 may be a light-transmitting organic material. For example, at least one of the first photosensitive polymer 1151, the second photosensitive polymer 1161, and the third photosensitive polymer 1171 may include polymer resin, such as acryl, BCB, or HMDSO.

The second capping layer CL2 may be disposed on the second bank layer 800 and the functional layer 500. The second capping layer CL2 may protect the second bank layer 800 and the functional layer 500. The second capping layer CL2 may prevent or reduce impurities, such as moisture and/or air, from permeating from the outside and damaging or polluting the second bank layer 800 and/or the functional layer 500. The second capping layer CL2 may include an inorganic material. In some embodiments, the second capping layer CL2 may be omitted in some cases.

The light absorption layer LWA may be disposed between the functional layer 500 and light-emitting diodes of the display panel 10. For example, the light absorption layer LWA may be disposed on the second capping layer CL2.

At least a portion of the light absorption layer LWA may be disposed between the first light-emitting diode LED1 corresponding to the first sub-pixel PX1 and the first quantum dot layer 510. For example, a first portion LWAa of the light absorption layer LWA may be disposed between the first light-emitting diode LED1 and the first quantum dot layer 510. The first portion LWAa may overlap the first central area CA1 and/or the first emission area EA1 in a plan view.

The light absorption layer LWA may transmit light emitted from the first light-emitting diode LED1 corresponding to the first sub-pixel PX1 and may absorb light having a long wavelength, for example, red light. For example, blue light emitted from the first light-emitting diode LED1 may pass through the light absorption layer LWA, and red light converted by the first quantum dot layer 510 and emitted toward the lower substrate 100 or reflected back from the opposite electrode 330 and/or the first sub-pixel electrode 310R may be absorbed by the light absorption layer LWA.

The light absorption layer LWA may have a light transmittance of about 60% or less in a red wavelength band. In an embodiment, the light absorption layer LWA may have a light transmittance of about 60% or less at a wavelength of about 600 nm to about 780 nm. In some embodiments, the light absorption layer LWA may have a light transmittance of about 60% or less at a wavelength of about 630 nm to about 670 nm. In some embodiments, the light absorption layer LWA may have a light transmittance of about 45% or less at a wavelength of about 600 nm to about 780 nm. In some embodiments, the light absorption layer LWA may have a light transmittance of about 45% or less at a wavelength of about 630 nm to about 670 nm.

The light absorption layer LWA may have a light transmittance of about 80% or greater in a blue wavelength band. In an embodiment, the light absorption layer LWA may have a light transmittance of about 80% or greater at a wavelength of about 400 nm to about 495 nm. In some embodiments, the light absorption layer LWA may have a light transmittance of about 80% or greater at a wavelength of about 450 nm to about 495 nm.

The light absorption layer LWA may include a pigment or a dye that transmits blue light and absorbs red light. In an embodiment, the light absorption layer LWA may include a blue or cyan pigment or dye. For example, the light absorption layer LWA may include a pigment, such as C.I. pigment blue 1, 2, 3, 15, 15:1, 15:2, 15:3, 15:4, 15:5, 15:6, 15:9, 16, 17, 17:1, 18, 22, 60, 63, 64, 65, 66 and/or C.I. pigment violet 23. Alternatively, the light absorption layer LWA may include a dye, such as C.I. solvent blue 4, 5, 25, 36, 37, 60, 67, 70, 90, 93, 95 and/or C.I. acid blue 1, 6, 7, 9, 15, 18, 22, 29, 42, 45, 59, 60, 62, 70, 72, 74, 82, 83, 86, 87, 90, 92, 93, 100, 102, 103, 104, 113, 117, 120, 126, 130, 131, 142, 147, 151, 154, 158, 161, 166, 167, 168, 170, 171, 184, 187, 192, 199, 210, 229, 234, 236, 242, 243, 256, 259, 267, 285, 296, 315, 335. In an embodiment, the light absorption layer LWA may include C.I. pigment violet 23 and/or C.I. pigment blue 15:9.

The light absorption layer LWA may include an organic insulating material. For example, the light absorption layer LWA may include one or more organic insulating materials selected from the group including polyimide, polyamide, acrylic resin, BCB, and phenolic resin.

At least a portion of the light absorption layer LWA may overlap the partition walls of the second bank layer 800 in a plan view. For example, second portions LWAb of the light absorption layer LWA may overlap the partition walls of the second bank layer 800 arranged between the first quantum dot layer 510 and the second quantum dot layer 520, between the first quantum dot layer 510 and the transmission layer 530, or between the second quantum dot layer 520 and the transmission layer 530, respectively. The second portion LWAb may be a portion extending from the first portion LWAa or a portion apart from the first portion LWAa. For example, some of the second portions LWAb may have an island shape. The second portions LWAb of the light absorption layer LWA may overlap the partition walls of the second bank layer 800 in a plan view, thereby absorbing light having a long wavelength and serving as a spacer maintaining a distance between the display panel 10 and the color conversion panel 20. According to an embodiment, by forming the light absorption layer LWA capable of serving as a spacer in an operation of manufacturing a spacer, the light absorption layer LWA may be formed even without adding a separate mask, which is economical in terms of processes.

In an embodiment, a thickness of the light absorption layer LWA in the direction z may be about 0.5 micrometers (μm) to about 10 μm. In some embodiments, a thickness of the light absorption layer LWA may be about 1 μm to about 5 μm. In some embodiments, a thickness of the light absorption layer LWA may be about 1 μm to about 3 μm. When the light absorption layer LWA has a thickness in the above range, the light absorption layer LWA may sufficiently absorb light having a long wavelength, for example, red light, while appropriately maintaining a distance between the display panel 10 and the color conversion panel 20.

The first and second quantum dot layers 510 and 520 of the functional layer 500 and the first to third color filters 610 to 630 of the color filter layer 600 may deteriorate due to light or heat, and thus, functions thereof may gradually deteriorate. Accordingly, luminance of the first to third sub-pixels PX1 to PX3 may decrease.

A portion of light emitted from the first and second quantum dot layers 510 and 520 of the functional layer 500 may travel in a direction (e.g., the direction −z) toward the display panel 10 and may be reflected from the opposite electrode 330 and/or the first to third sub-pixel electrodes 310R, 310G, and 310B. A portion of the reflected light reaches the functional layer 500 and/or the color filter layer 600 again, and thus, as an amount of light reflected from the display panel 10 increases, damage to the functional layer 500 and the color filter layer 600 may relatively accelerate. In this regard, a reflectance of light having a long wavelength, for example, red light, may be greater than a reflectance of light in another wavelength band. In this case, the first quantum dot layer 510 and the first color filter 610 corresponding to the first sub-pixel PX1 emitting red light may deteriorate faster than each of the second quantum dot layer 520 and the second color filter 620 corresponding to the second sub-pixel PX2 emitting green light and the third color filter 630 corresponding to the third sub-pixel PX3 emitting blue light. Accordingly, a luminance maintenance rate of the first sub-pixel PX1 may be lower than each of luminance maintenance rates of the second sub-pixel PX2 and the third sub-pixel PX3.

In a comparative example, when a display apparatus does not include a light absorption layer disposed between a first light-emitting diode and a first quantum dot layer, as described above, there is a difference in luminance between a first sub-pixel, a second sub-pixel, and a third sub-pixel, and thus, color characteristics of the display apparatus 1 may deteriorate, and the apparatus may have a decreased lifespan.

However, the display apparatus 1 according to an embodiment may include the light absorption layer LWA at least partially disposed between the first light-emitting diode LED1 and the first quantum dot layer 510. In this case, the light absorption layer LWA may partially absorb red light emitted from the first quantum dot layer 510 and travelling toward the display panel 10 or reflected from the opposite electrode 330 and/or the first sub-pixel electrode 310R, and thus, deterioration of the first quantum dot layer 510 and the first color filter 610 may be prevented from being accelerated due to light of a long wavelength (e.g., red light) excessively reflected compared to light in another wavelength band. A luminance maintenance rate of the first sub-pixel PX1 may be adjusted so as to be similar to those of the second sub-pixel PX2 and the third sub-pixel PX3. Accordingly, color characteristics of the display apparatus 1 may be improved, and the apparatus may also have an increased lifespan.

The filler 900 may be disposed between the display panel 10 and the color conversion panel 20. In an embodiment, the filler 900 may be disposed on the light absorption layer LWA and/or the second capping layer CL2. The filler 900 may serve as a buffer against external pressure or the like. The filler 900 may include an organic material such as methyl silicone, phenyl silicone, polyimide, etc. However, one or more embodiments are not limited thereto. In another embodiment, the filler 900 may include urethane-based resin, epoxy-based resin, acryl-based resin, which are organic sealants, or silicone, which is an inorganic sealant.

Figure 6:
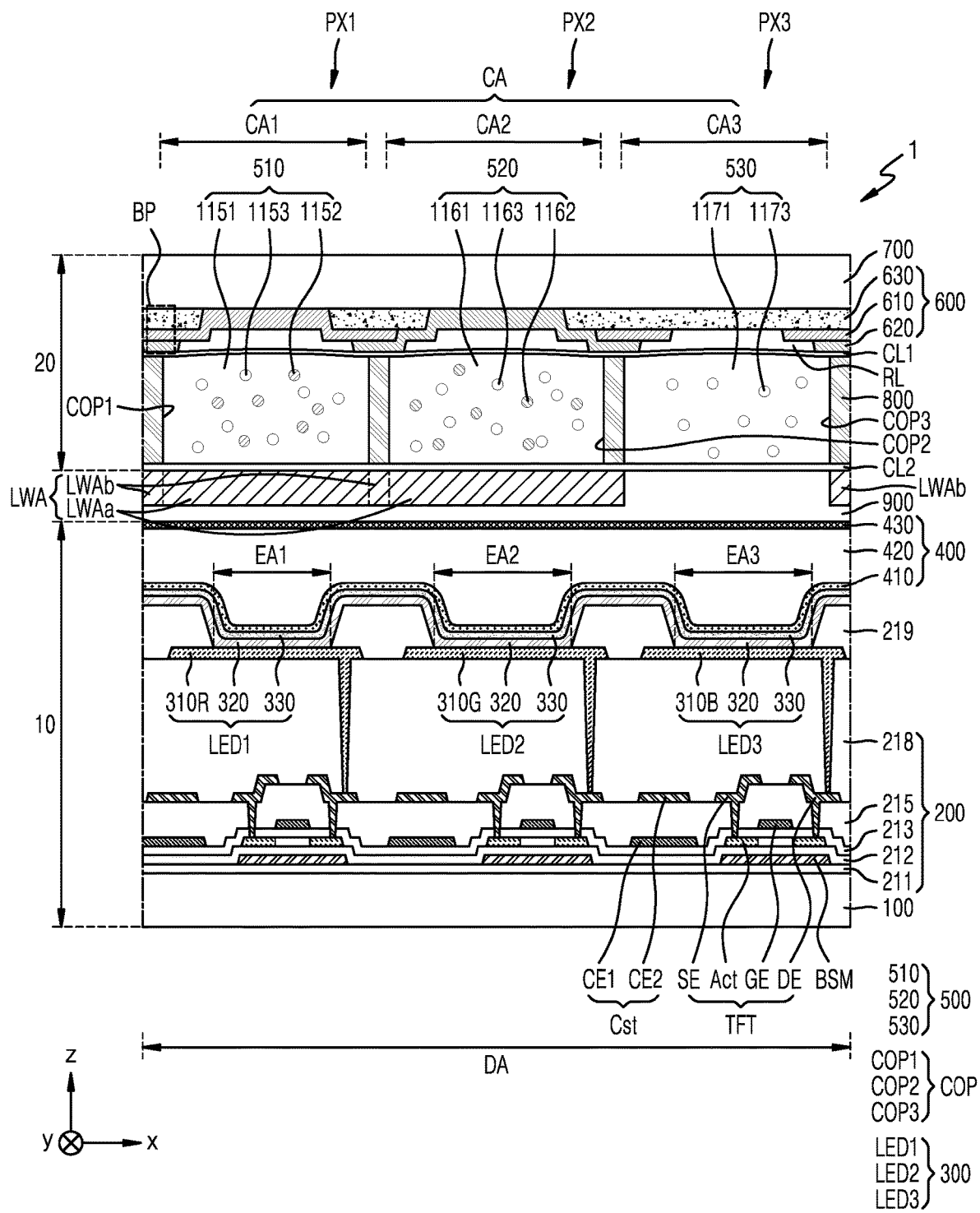
FIG. 6 is a schematic cross-sectional view of a display apparatus according to another embodiment.
Figure 7:
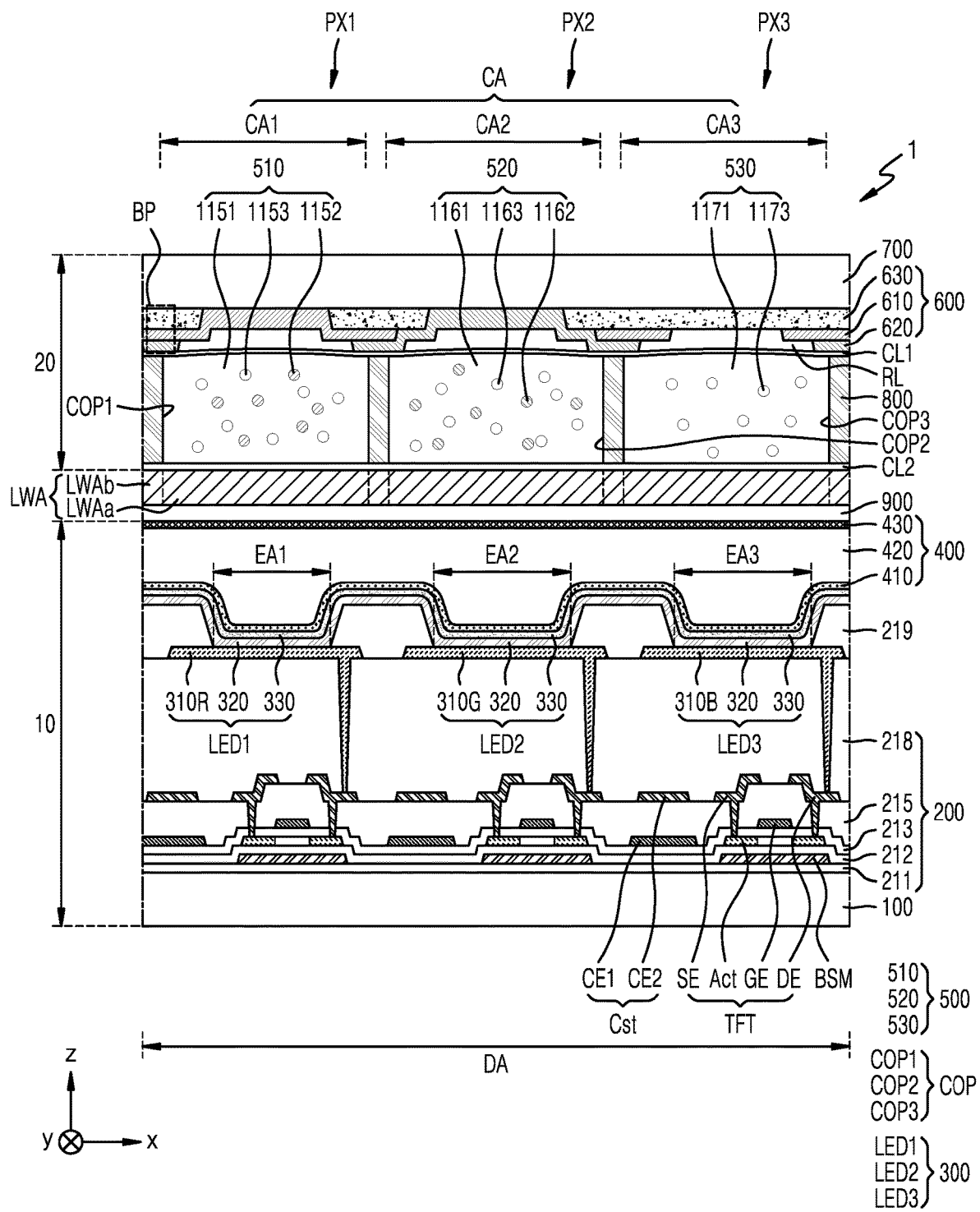
FIG. 7 is a schematic cross-sectional view of a display apparatus according to still another embodiment.

FIG. 6 is a schematic cross-sectional view of the display apparatus 1 according to another embodiment. FIG. 7 is a schematic cross-sectional view of the display apparatus 1 according to still another embodiment. Referring to FIGS. 6 and 7, there are differences in the light absorption layer LWA from the embodiment of FIG. 5. Hereinafter, differences in the light absorption layer LWA will be mainly described, and a redundant description thereof is omitted.

Referring to FIG. 6, the light absorption layer LWA of the display apparatus 1 may also extend between the second light-emitting diode LED2 and the second quantum dot layer 520 corresponding to the second sub-pixel PX2. For example, some of the first portions LWAa of the light absorption layer LWA may be disposed between the first light-emitting diode LED1 and the first quantum dot layer 510, and some other first portions LWAa may be disposed between the second light-emitting diode LED2 and the second quantum dot layer 520. The first portion LWAa disposed between the second light-emitting diode LED2 and the second quantum dot layer 520 may overlap the second central area CA2 and/or the second emission area EA2 in a plan view.

Referring to FIG. 7, the light absorption layer LWA of the display apparatus 1 may be disposed on the entire surface without being patterned. For example, the light absorption layer LWA may be formed as one body over the first sub-pixel PX1, the second sub-pixel PX2, and the third sub-pixel PX3.

Referring to FIGS. 6 and 7, the light absorption layer LWA may transmit light emitted from the second light-emitting diode LED2 corresponding to the second sub-pixel PX2 and may absorb light having a long wavelength, for example, green light. For example, blue light emitted from the second light-emitting diode LED2 may pass through the light absorption layer LWA, and green light converted by the second quantum dot layer 520 and emitted toward the lower substrate 100 or reflected back from the opposite electrode 330 and/or the second sub-pixel electrode 310G may be absorbed by the light absorption layer LWA.

The light absorption layer LWA may have a light transmittance of about 60% or less in a green wavelength band. In an embodiment, the light absorption layer LWA may have a light transmittance of about 60% or less at a wavelength of about 500 nm to about 570 nm. In some embodiments, the light absorption layer LWA may have a light transmittance of about 60% or less at a wavelength of about 530 nm to about 570 nm. In some embodiments, the light absorption layer LWA may have a light transmittance of about 45% or less at a wavelength of 500 nm to 570 nm. In some embodiments, the light absorption layer LWA may have a light transmittance of about 45% or less at a wavelength of about 530 nm to about 570 nm.

The light absorption layer LWA may have a light transmittance of about 60% or less in a red wavelength band. In an embodiment, the light absorption layer LWA may have a light transmittance of about 60% or less at a wavelength of about 600 nm to about 780 nm. In some embodiments, the light absorption layer LWA may have a light transmittance of about 60% or less at a wavelength of about 630 nm to about 670 nm. In some embodiments, the light absorption layer LWA may have a light transmittance of about 45% or less at a wavelength of about 600 nm to about 780 nm. In some embodiments, the light absorption layer LWA may have a light transmittance of about 45% or less at a wavelength of about 630 nm to about 670 nm.

The light absorption layer LWA may have a light transmittance of about 80% or greater in a blue wavelength band. In an embodiment, the light absorption layer LWA may have a light transmittance of about 80% or greater at a wavelength of about 400 nm to about 495 nm. In some embodiments, the light absorption layer LWA may have a light transmittance of about 80% or greater at a wavelength of about 450 nm to about 495 nm.

The light absorption layer LWA may include a pigment or a dye that transmits blue light and absorbs red light and green light. In an embodiment, the light absorption layer LWA may include a blue pigment or dye.

The display apparatus 1 according to an embodiment may additionally prevent deterioration of the second quantum dot layer 520 and the second color filter 620 from being accelerated due to a large amount of reflection of green light having a relatively long wavelength. Accordingly, luminance maintenance rates of the first to third sub-pixels PX1 to PX3 may be adjusted so as to be similar to one another. Accordingly, color characteristics of the display apparatus 1 may be effectively improved, and the apparatus may also have an increased lifespan.

Figure 8:
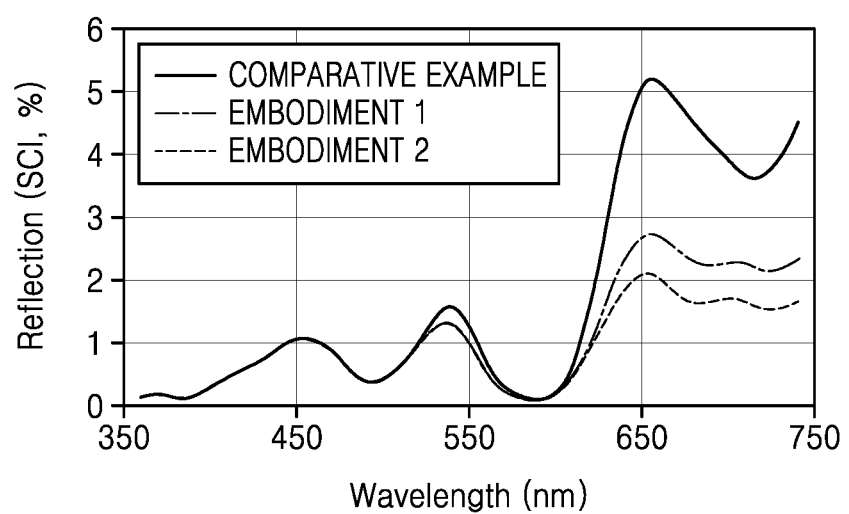
FIG. 8 is a graph showing the reflectance of a display apparatus according to an embodiment and a comparative example.

FIG. 8 is a graph showing the reflectance of a display apparatus according to an embodiment and a comparative example. FIG. 8 shows measurements of Specular Component Included ("SCI") reflectance in each wavelength band of a display apparatus according to embodiment 1, embodiment 2, and a comparative example, and in this regard, "SCI reflectance," which is a reflectance measured in SCI mode, refers to a reflectance including light specularly reflected after incidence and light diffusely reflected after incidence. The comparative example corresponds to a display apparatus that does not include a light absorption layer, and embodiments 1 and 2 correspond to the display apparatus 1 including the light absorption layer LWA having a thickness of 1 µm and 2 µm, respectively.

As shown in FIG. 8, the display apparatus 1 according to an embodiment may include the light absorption layer LWA, thereby significantly reducing a reflectance of light having a long wavelength, particularly, red light.

According to one or more embodiments, at least a portion of a light absorption layer absorbing red light may be disposed between a light-emitting diode and a quantum dot layer corresponding to a red sub-pixel to reduce reflected light in a red wavelength band, and thus, a display apparatus having improved color characteristics and an improved lifespan may be provided. However, one or more embodiments are not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
 a first sub-pixel, a second sub-pixel, and a third sub-pixel, which emit light of different colors from one another;
 light-emitting diodes corresponding to the first sub-pixel, the second sub-pixel, and the third sub-pixel, respectively, and which emit light of a same color;
 a functional layer arranged in a light-emitting direction of the light-emitting diodes and comprising a first quantum dot layer corresponding to an emission area of the first sub-pixel and a second quantum dot layer corresponding to an emission area of the second sub-pixel; and
 a light absorption layer disposed between the light-emitting diodes and the functional layer,
 wherein at least a portion of the light absorption layer is disposed between the light-emitting diode corresponding to the first sub-pixel and the first quantum dot layer,
 wherein the first sub-pixel is a red sub-pixel, and
 wherein the light absorption layer comprises a pigment or a dye, which absorbs red light.

2. The display apparatus of claim 1, wherein the light absorption layer comprises a blue or cyan pigment or dye.

3. The display apparatus of claim 1, wherein the light absorption layer has a light transmittance of about 80% or greater in a wavelength range of about 400 nanometers (nm) to about 495 nm.

4. The display apparatus of claim 1, wherein the light absorption layer has a light transmittance of about 60% or less in a wavelength range of about 600 nm to about 780 nm.

5. The display apparatus of claim 1, wherein a portion of the light absorption layer overlaps a partition wall arranged between the first quantum dot layer and the second quantum dot layer in a plan view.

6. The display apparatus of claim 1, wherein another portion of the light absorption layer is disposed between the light-emitting diode corresponding to the second sub-pixel and the second quantum dot layer.

7. The display apparatus of claim 6, wherein the second sub-pixel is a green sub-pixel,
 wherein the light absorption layer comprises a pigment or a dye, which absorbs green light.

8. The display apparatus of claim 7, wherein the light absorption layer comprises a blue pigment or dye.

9. The display apparatus of claim 7, wherein the light absorption layer has a light transmittance of about 60% or less in a wavelength range of about 500 nm to about 570 nm.

10. The display apparatus of claim 1, wherein the light absorption layer has a thickness of about 0.5 micrometers (µm) to about 10 µm.

11. A display apparatus comprising:
 a first sub-pixel, a second sub-pixel, and a third sub-pixel, which emit light of different colors from one another;

light-emitting diodes corresponding to the first sub-pixel, the second sub-pixel, and the third sub-pixel, respectively, and which emit blue light;
a functional layer arranged in a light-emitting direction of the light-emitting diodes and comprising a first quantum dot layer corresponding to an emission area of the first sub-pixel and a second quantum dot layer corresponding to an emission area of the second sub-pixel, wherein the first quantum dot layer is configured to convert the blue light emitted from the light-emitting diode corresponding to the first sub-pixel into red light; and
a light absorption layer disposed between the light-emitting diodes and the functional layer,
wherein at least a portion of the light absorption layer is disposed between the light-emitting diode corresponding to the first sub-pixel and the first quantum dot layer, and
wherein the light absorption layer has a light transmittance of about 60% or less in a wavelength range of about 600 nm to about 780 nm.

12. The display apparatus of claim 11, wherein the light absorption layer has a light transmittance of about 80% or greater in a wavelength range of about 400 nm to about 495 nm.

13. The display apparatus of claim 11, wherein the light absorption layer comprises a pigment or a dye, which absorbs red light.

14. The display apparatus of claim 11, wherein the light absorption layer comprises a blue or cyan pigment or dye.

15. The display apparatus of claim 11, wherein a portion of the light absorption layer overlaps a partition wall arranged between the first quantum dot layer and the second quantum dot layer in a plan view.

16. The display apparatus of claim 11, wherein the light absorption layer extends between the light-emitting diode corresponding to the second sub-pixel and the second quantum dot layer.

17. The display apparatus of claim 16, wherein the second sub-pixel is a green sub-pixel,
wherein the light absorption layer comprises a pigment or a dye, which absorbs green light.

18. The display apparatus of claim 17, wherein the light absorption layer comprises a blue pigment or dye.

19. The display apparatus of claim 16, wherein the light absorption layer has a light transmittance of about 60% or less in a wavelength range of about 500 nm to about 570 nm.

20. The display apparatus of claim 11, wherein the light absorption layer has a thickness of about 0.5 μm to about 10 μm.

* * * * *